(12) United States Patent
Thieme et al.

(10) Patent No.: US 7,463,915 B2
(45) Date of Patent: Dec. 9, 2008

(54) STACKED FILAMENTARY COATED SUPERCONDUCTORS

(75) Inventors: Cornelis Leo Hans Thieme, Westborough, MA (US); Martin W. Rupich, Framingham, MA (US)

(73) Assignee: American Superconductor Corporation, Devens, MA (US)

( * ) Notice: Subject to any disclaimer, the term of this patent is extended or adjusted under 35 U.S.C. 154(b) by 862 days.

(21) Appl. No.: 10/955,801

(22) Filed: Sep. 29, 2004

(65) Prior Publication Data

US 2006/0073975 A1    Apr. 6, 2006

Related U.S. Application Data

(60) Provisional application No. 60/603,202, filed on Aug. 20, 2004.

(51) Int. Cl.
*H01B 12/00* (2006.01)
*H01L 39/00* (2006.01)
*H01L 39/24* (2006.01)
*H01F 6/00* (2006.01)

(52) U.S. Cl. .................. 505/231; 505/230; 505/236; 505/237; 505/238; 505/431; 174/121.5; 29/599; 428/699; 428/701

(58) Field of Classification Search .......... 505/230, 505/231, 232, 236–238, 431, 887; 428/699, 428/701; 174/121.5; 29/599; 335/216, 296
See application file for complete search history.

(56) References Cited

U.S. PATENT DOCUMENTS

| | | | |
|---|---|---|---|
| 5,231,074 A | 7/1993 | Cima et al. | |
| 5,683,967 A | 11/1997 | Frenkel | |
| 5,908,812 A * | 6/1999 | Cotton et al. | ............... 505/230 |
| 5,929,000 A * | 7/1999 | Hahakura et al. | ........... 505/231 |
| 6,022,832 A | 2/2000 | Fritzemeier et al. | |

(Continued)

FOREIGN PATENT DOCUMENTS

WO    WO-98/58415    12/1998

(Continued)

OTHER PUBLICATIONS

Glowacki, "Preparation of $Bi_2Sr_2CaCu_2O_{8-x}$ tracks and thick films by jet printing", IOP Publishing Ltd. 2000, pp. 584-591.

(Continued)

*Primary Examiner*—Stanley Silverman
*Assistant Examiner*—Kallambella Vijayakumar
(74) *Attorney, Agent, or Firm*—Wilmer Cutler Pickering Hale & Dorr LLP

(57) ABSTRACT

An elongated article comprising a first layer of oxide superconductor filaments extending substantially along the length of the elongated article and spaced apart from one another across the width of the elongated substrate; a second layer of oxide superconductor filaments extending substantially along the length of the elongated article and spaced apart from one another across the width of the elongated article, wherein the first filament layer is positioned above the second filament layer; and a barrier layer positioned between the first and second filament layers, wherein the filaments of the first and second filament layers are positioned such that at least one filament of the first layer crosses at least one filament of the second layer.

25 Claims, 11 Drawing Sheets

U.S. PATENT DOCUMENTS

| | | | |
|---|---|---|---|
| 6,027,564 | A | 2/2000 | Fritzemeier et al. |
| 6,077,344 | A | 6/2000 | Schoup et al. |
| 6,190,752 | B1 | 2/2001 | Do et al. |
| 6,258,754 | B1 | 7/2001 | Sengupta |
| 6,399,154 | B1 | 6/2002 | Williams et al. |
| 6,436,317 | B1 * | 8/2002 | Malozemoff et al. ...... 252/519.1 |
| 6,440,211 | B1 | 8/2002 | Beach et al. |
| 6,493,411 | B1 | 12/2002 | Chu et al. |
| 6,498,302 | B2 * | 12/2002 | Kaneko ................... 174/125.1 |
| 6,510,604 | B1 | 1/2003 | Pourrahimi |
| 6,525,002 | B1 | 2/2003 | Weinstein |
| 6,552,415 | B1 | 4/2003 | Paul et al. |
| 6,562,761 | B1 | 5/2003 | Fritzemeier et al. |
| 6,569,811 | B1 | 5/2003 | Shi |
| 6,602,588 | B1 | 8/2003 | Kwon et al. |
| 6,617,284 | B1 | 9/2003 | Rokhvarger et al. |
| 6,624,122 | B1 | 9/2003 | Holesinger et al. |
| 6,669,774 | B1 | 12/2003 | Zhang et al. |
| 6,673,387 | B1 | 1/2004 | Zhang et al. |
| 6,716,545 | B1 | 4/2004 | Holesinger et al. |
| 6,725,071 | B2 * | 4/2004 | Albrecht et al. ............. 505/231 |
| 6,765,151 | B2 * | 7/2004 | Fritzemeier et al. ...... 174/125.1 |
| 6,797,313 | B2 | 9/2004 | Fritzemeier et al. |
| 6,828,507 | B1 * | 12/2004 | Fritzemeier et al. ...... 174/125.1 |
| 6,893,732 | B1 | 5/2005 | Fritzemeier et al. |
| 6,918,172 | B2 * | 7/2005 | Wong .......................... 29/599 |
| 6,974,501 | B1 | 12/2005 | Zhang et al. |
| 2002/0056401 | A1 | 5/2002 | Rupich et al. |
| 2002/0178999 | A1 | 12/2002 | Beach et al. |
| 2005/0065035 | A1 | 3/2005 | Rupich et al. |
| 2007/0145100 | A1 | 6/2007 | Suzuki et al. |

FOREIGN PATENT DOCUMENTS

| | | |
|---|---|---|
| WO | WO-99/16941 | 4/1999 |
| WO | WO-99/17307 | 4/1999 |
| WO | WO-00/58044 | 10/2000 |
| WO | WO-00/58530 | 10/2000 |
| WO | WO-01/08169 | 2/2001 |
| WO | WO-01/08170 | 2/2001 |
| WO | WO-01/08231 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |

OTHER PUBLICATIONS

Creagh et al., "Design and Performance of Inkjet Print Heads for Non-Graphic-Arts Applications," MRS Bulletin, Nov. 2003, pp. 807-811.
Sirringhaus, et al., "Inkjet Printing of Functional Materials," MRS Bulletin, Nov. 2003, pp. 802-806.
Shimoda, et al., "Inkjet Printing of Light-Emitting Polymer Displays," MRS Bulletin, Nov. 2003, pp. 821-827.
Burns, et al., "Inkjet Printing of Polymer Thin-Film Transistor Circuits," MRS Bulletin, Nov. 2003, pp. 829-834.
Derby et al., "Inkjet Printing of Highly Loaded Particulate Suspensions," MRS Bulletin, Nov. 2003, pp. 815-818.
George A Levin, "Concept of Multiply Connected Superconducting Tapes," AFOSR MURI Workshop on Coated Conductors, Jan. 21, 2004, 38 pages.
Paul N. Barnes, PH.D., "AC Loss Reduction," AFOSR Review, Jan. 19-21, 2004, 16 pages.
American Superconductor Oak Ridge National Laboratory, "Low-Cost Fabrication of 2G Wire for AC Applications," SuperHyPe Program Review, Jan. 10, 2005, 12 pages.
U.S. Appl. No. 60/309,116, filed Jul. 31, 2001, Fritzemeier et al.
U.S. Appl. No. 60/477,613, filed Jun. 10, 2003.
U.S. Appl. No. 60/308,957, filed Jul. 31, 2001.
U.S. Appl. No. 60/166,297, filed Nov. 18, 1999.
Ashworth, et al., "AC Losses in Silver Clad $Tc$ Superconducting Tapes," Chinese Journal of Physics, 1996, vol. 34(2-11), pp. 232-242.
Babu, et al., "New Chemically Stable, Nano-Size Artificial Flux Pinning Centres in (RE)-Ba-Cu-O Superconductor," Superconductor Sci. and Tech., 2003, vol. 16, L44-L45.
Beach, et al., "Sol-Gel Synthesis of Rare Earth Aluminate Films as Buffer Layers for High $T_c$ Superconducting Films," Mat. Res. Soc. Symp. Proc., 1998, vol. 495, pp. 263-270.
Carr, et al., "Filamentary YBCO Conductors for AC Applications," I.E.E.E. Transactions on Applied Superconductivity, 1999, vol. 9(2), pp. 1475-1478.
di Uccio et al., "Phase Competition Between $Y_2BaCuO_5$ and $Y_2O_3$ Precipitates in Y-rich YBCO Thin Films," Physica C, 1999, vol. 321, pp. 162-176.
Gammel et al., Observation of Hexagonally Correlated Flux Quanta in $YBa_2Cu_3O_7$, Phys. Rev. Lett., 1987, vol. 59(22), pp. 2592.-2595.
Glowacki, et al., "A New Method for Decreasing Transport AC Losses in Multifilamentary Coated Superconductors," Physica C, 2001, vol. 357-360., pp. 1213-1217.
Haugan et al., "Island Growth of $Y_2BaCuO_5$ Nanoparticles in (211~1.5nm/123~10mn)×$N$ Composite Multilayer Structures to Enhance Flux Pinning of $YBa_2Cu_3O_{7-\delta}$ Films," J. Mater. Res., 2003, vol. 18(11), pp. 2618-2623.
Huang, "Oxide Barriers and Their Effect on AC Losses of Bi,Pb (2223) Multifilamentary Tapes," 1998, Applied Superconductivity Conference.
Jin et al., "Superconducting Properties of $YBa_2Cu_3O_{7-\delta}$ with Partial Rare Earth Substitution," Physica C, 1991, vol. 173, pp. 75-79.
Kehl, "The Principles of Metallographic Laboratory Practice," Third Edition, 1949, McGraw-Hill Book Company.
Lee et al., "Alternative Buffer Architectures for High Critical Current Density YBCO Superconducting Deposits on Rolling Assisted Biaxially-Textured Substrates," Jpn. J. Appl. Phys., 1999, vol. 38, pp. L178-L180.
MacManus-Driscoll et al., "Strongly Enhanced Current Densitites in Superconducting Coated Conductors of $BaZrO_3$-Doped $YBa_2Cu_3O_{7-x}$," Superconductivity Tech. Center, Los Alamos Nat'l Lab., pp. 1-7.
Majoros, et al., "Modelling of the Influence of Magnetic Screening on Minimisation of Transport AC Losses in Multifilamentary Superconductors," I.E.E.E. Transactions on Applied Superconductivity, 2001, vol. 1(1), pp. 2780-2783.
Malozemoff, "Second Generation HTS Wire: An Assessment," 2004, American Superconductor Brochure.
Morrell et al., Sol-Gel Synthesis of Epitaxial Films of (Sr, Ba) $Bi_2(Nb,Ta)_2O_9$ and $Bi_4Ti_3O_{12}$ on [100] $SrTiO_3$, Mat. Res. Soc. Symp. Proc., 1998, vol. 495, pp. 271-276.
Oberly, et al., "AC Loss Analysis for Superconducting Generator Armatures Wound with Subdivided Y-Ba-$C_4$-O Coated Tape," Cryogenics, 2001, vol. 41, pp. 117-124.
Oomen, et al., "AC Loss in High-Temperature Superconducting Conductors, Cables, and Windings for Power Devices," Superconductor Science and Technology, 2004, vol. 17, pp. S394-S399.
Paranthaman et al., "Growth of Biaxially Textured $RE_2O_3$ Buffer Layers on Rolled-Ni Substrates Using Reactive Evaporation for HTS-Coated Conductors," Superconductor Sci. Tech., 1999, vol. 12, pp. 319-325.
Rupich et al., "Growth and Characterization of Oxide Buffer Layers for YBCO Coated Conductors," I.E.E.E. Trans. on Appl. Supercon., 1999, vol. 9(2), pp. 1527-1530.
Shoup et al., "Epitaxial Thin Film Growth of Lanthanum and Neodymium Aluminate Films on Roll-Textured Nickel Using a Sol-Gel Method," J. Am. Cer. Soc., 1998, vol. 81, pp. 3019-3021.
Skakle "Crystal Chemical Substitutions and Doping of $YBa_2Cu_3O_x$ and Related Superconductors," Materials Science and Engineering, 1998, vol. R23, pp. 1-40.
Wolf, et al., "Silicon Processing for the VLSI Era," 1986, vol. 1, pp. 539-574, Lattice Press, Sunset Park, CA.

Wu, et al., "Twin Boundaries and Critical Current Densities of YBa$_2$Cu$_3$O$_7$ Thick Films Fabricated by the BaF$_2$ Process," Superconductor Sci. and Tech., 2003, vol. 16, pp. 1127-1133.

Ashworth, Los Alamos National Laboratory, "AC Losses in Coated Conductors", Superconductivity for Electric Systems Annual Peer Review, Washington, DC Jul. 27-29, 2004.

U.S. Patent and Trademark Office, International Search Report mail Aug. 16, 2006, 3 pages.

U.S. Patent and Trademark Office, International Search Report mailed Sep. 5, 2006, 3 pages.

* cited by examiner

C. E. Oberly, L. Long, G. L. Rhoads and W. J. Carr Jr, Cryogenics, 41, 117-124 (2001).

STACKED FILAMENTARY COATED SUPERCONDUCTORS

RELATED APPLICATIONS

This application claims priority under 35 U.S.C. § 119(e) to copending U.S. Application Ser. No. 60/603,202, filed Aug. 20, 2004, and entitled "Dropwise Deposition Of A Patterned Oxide Superconductor," which is hereby incorporated in its entirety by reference.

This application is related to copending applications U.S. application Ser. No. 10/955,866; filed on event date herewith and entitled "Dropwise Deposition Of A Patterned Oxide Superconductor" and U.S. application Ser. No. 10/955,875; filed on event date herewith and entitled "Low Ac Loss Filamentary Coated Superconductors," which are hereby incorporated by reference.

BACKGROUND

1. Field of the Invention

This invention relates to filamentary multilayer superconductor articles. The invention also relates to superconductor articles suitable for use in alternating current (ac) and time varying magnetic field applications.

2. Background of the Invention

Since the discovery of high-temperature superconducting (HTS) materials (superconducting above the liquid nitrogen temperature of 77 K) there have been efforts to develop various engineering applications using such HTS materials. In thin film superconductor devices and wires, significant progress has been made with fabrication of devices utilizing an oxide superconductor including yttrium, barium, copper and oxygen in the well-known basic composition of $YBa_2Cu_3O_{7-x}$ (hereinafter referred to as "YBCO"). Biaxially textured superconducting metal oxides, such as YBCO, have achieved high critical current densities in a coated conductor architecture, often referred to as second generation HTS wires, or a "coated conductor." The expression "HTS wire" indicates a HTS conductor with the attributes that make it useful for the construction of a superconducting device; its cross-sectional geometry can vary from wire-like to round.

Typically, second generation HTS wires 10 include a metal substrate 11, buffer layer(s) 12, and an active layer 13, e.g., a superconductor, as illustrated in FIG. 1. The metal substrate, such as Ni, Ag, or Ni alloys, provides flexibility for the article and can be fabricated over long lengths and large areas. The buffer layer(s) consists of metal oxide layers, such as $LaAlO_3$, $Y_2O_3$, $CeO_2$, or yttria-stabilized zirconia (YSZ); it makes up the next layer and serves as a chemical barrier layer between the metal substrate and the active layer. The buffer layer(s) reduces oxidation of the substrate and also reduces the diffusion of chemical species between the substrate and the superconductor layer. Moreover, the buffer layer(s) can have a coefficient of thermal expansion that is well matched with the superconductor material.

To achieve high critical current densities in the wire, the superconducting material has a sharp biaxial texture. As used herein, "biaxially textured" refers to a surface for which the crystal grains are in close alignment with a direction in the plane of the surface and a direction perpendicular to the surface. One type of biaxially textured surface is a cube textured surface, in which the crystal grains are also in close alignment with a direction perpendicular to the surface. Cube textured metal foils such as Ni or Ni alloys can serve as a substrate for high quality HTS wires.

When using a cube textured substrate the buffer layer is an epitaxial layer, that is, its crystallographic orientation is directly related to the crystallographic orientation of the substrate surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer.

Second generation HTS wire can be incorporated into a variety of devices for many applications, including cables, motors, generators, synchronous condensers, transformers, current limiters, and magnet systems. The incorporation of second generation superconducting YBCO wires into such devices provides the opportunity to dramatically reduce the device cooling requirements, thus enabling the development of lightweight, compact, high-power sources. Currently a wide, e.g., several millimeters, tape configuration is used to reach practical electrical currents.

Many potential applications for HTS wires involve operating the superconductor in the presence of ramped magnetic or oscillating magnetic fields, or require that the HTS wire carry alternating current. In the presence of time-varying magnetic fields or currents, there are a variety of mechanisms that give rise to energy dissipation, hereinafter referred to as "ac losses." Although second generation HTS wire is currently suitable for many types of electric power devices, including power transmission cables and rotor sections of motors, the ac losses from the current HTS wires are too high for use in demanding HTS applications in which the alternating magnetic fields have a higher amplitude or frequency. The use of an HTS wire with greatly reduced ac losses would enhance the application of these wires in a great variety of novel, HTS-based devices.

There are a number of factors contributing to the total ac loss in a superconducting wire, such as superconducting properties and dimensions of the superconducting oxide film, and the electrical and magnetic properties of the metal constituents of the conductor. A major contributor to the ac losses is so-called hysteretic losses in the superconducting oxide film caused by an oscillating external magnetic field. This loss contribution is proportional to the film width as seen by the magnetic field direction, and is therefore greatest when the magnetic field is perpendicular to the film surface, or when the alternating magnetic field has a large perpendicular component. For current HTS superconductor widths even a moderate ac frequency and magnetic field perpendicular to the superconducting film plane can produce very large ac losses. It has been proposed to divide an oxide superconducting film into narrow filaments to suppress ac loss in a superconducting oxide thin film.

FIG. 2 is a cross-sectional view of a coated conductor article in which the superconducting film is arranged as a thin filament array. The multilayer article 20 includes a metal substrate 21 having a textured surface and epitaxially grown buffer layer(s) 22. Such textured bases have been previously described. A RABiTS™ (rolling-assisted, biaxially textured substrates) textured template is typically used. A RABiTS™ substrate is a roll-textured and annealed metal tape, e.g., nickel or nickel alloy such as NiW with a sharp cube texture, covered in an epitaxial manner with one or more oxide or metal buffer or conditioning layers. Another variation used to prepare the textured template is ion beam assisted deposition or IBAD. The resulting textured base serves as a template for the HTS compound, e.g., yttrium-barium-copper-oxide (YBCO). Superconductor filaments 23 run substantially continuously along the length of the base to form an array of substantially parallel filaments. The superconducting filaments are crystallographically oriented and typically exhibit biaxial texture.

SUMMARY OF THE INVENTION

In one aspect, the present invention provides low ac loss filamentary coated superconductors.

In one aspect of the invention, an elongated article includes a first layer of oxide superconductor filaments extending substantially along the length of the elongated substrate and spaced apart from one another across the width of the elongated article, a second layer of oxide superconductor filaments extending substantially along the length of the elongated article and spaced apart from one another across the width of the elongated article, wherein the first filament layer is positioned above the second filament layer, and a barrier layer positioned between the first and second filament layers. The filaments of the first and second filament layers are positioned such that at least one filament of the first layer crosses at least one filament of the second layer.

In one or more embodiments, the second filament layer is disposed on an elongated substrate having a textured surface. The first filament layer can also be disposed on an elongated substrate having a textured surface.

In one or more embodiments the crossing filament of the first layer occupies first position across the width of the elongated substrate before the crossing and a second position across the width of the elongated substrate after crossing. At least one filament of the second layer can cross at least one filament of the first layer. A plurality of filaments in the first layer can cross at least one filament in the second layer.

In one or more embodiments, the article includes about 2 to about 100 filaments; and/or the space between adjacent filaments is in the range of about 10 μm to about 100 μm. The filaments can have a width of about 50 to 1000 μm.

In one or more embodiments, the distance along the length of the article between neighboring crossing locations is in the range of about 0.05 m to about 100 m, or about 0.2 m to about 10 m.

In one or more embodiments, the space between adjacent filaments comprises a poorly conductive material, or a material of medium to high resistivity. The space between adjacent filaments can also include a conductive bridge.

In one or more embodiments, the barrier layer includes a medium to high resistivity material, which is, for example, selected from the group consisting of copper-nickel alloy, nickel alloys and stainless steel.

In one or more embodiments, the barrier layer includes a conductive oxide.

In one or more embodiments, the article further includes a cap layer disposed above the first filament layer, which can be a noble metal. In further embodiments, a stabilizer layer is disposed on the cap layer, which can be a medium to high resistivity metal.

In one or more embodiments, the substrate comprises a metal comprising a biaxially textured surface, and the substrate further may include an epitaxially textured oxide buffer layer disposed on the biaxially textured metal surface. The oxide superconductor may be a rare earth-alkaline earth-copper oxide.

In one or more embodiments, the article further includes one or more additional filament layers disposed between the first and second filament layers, wherein the at least one filament of the additional filament layers crosses a filament of the first or second filament layer.

In another aspect of the invention, a low ac loss article first and second elongated substrates having a length and a width, in which each elongated substrate includes a superconducting layer having a plurality of oxide superconducting filaments extending substantially along the length of the elongated substrate and spaced apart from one another across the width of the elongated substrate. A barrier layer is interposed between the first and second elongated substrates, and the superconducting layers on the first and second elongated substrates are positioned in facing orientation relative to one another such that a filament of the first elongated substrate periodically cross a filament of the second elongated substrate.

In one or more embodiments, at least one filament of the second layer crosses at least one filament of the first layer.

In at least one embodiment, a plurality of filaments in the first layer crosses at least one filament in the second layer.

In at least one embodiment, the plurality of filaments in a superconducting layer periodically shift in alternating directions across the width by about one filament position.

In one or more embodiments, the space between adjacent filaments includes a material selected from the group consisting of a poorly conductive material, a medium to high resistivity material, and a poorly conductive material. The space between adjacent filaments may also include a conductive bridge.

In one or more embodiments, the article further includes a cap layer disposed on the filament layer and the barrier layer, for each of the first and second elongated substrates. The cap layer can be joined with the barrier layer by solder.

In another aspect of the invention, a multi-layer high temperature superconductor having low ac loss includes a first high temperature superconductor coated element, including:
a first substrate;
at least one first buffer deposited on the first substrate;
at least one first high temperature superconductor layer supported by the first buffer, said superconducting layer comprising a plurality of filaments extending substantially along the length of the elongated substrate and spaced apart from one another across the width of the elongated substrate; and
a first metallic cap layer supported by the first high temperature superconductor layer;
a second high temperature superconductor coated element, comprising:
a second substrate;
at least one second buffer deposited on the second substrate;
at least one second high temperature superconductor layer supported by the second buffer, said superconducting layer comprising a plurality of filaments extending substantially along the length of the elongated substrate and spaced apart from one another across the width of the elongated substrate; and
a second metallic cap layer supported by the second high temperature superconductor layer; and
an intervening metallic layer disposed between and joining the first and second metallic can layers so that the first and second metallic cap layers are between the first and second high temperature superconductor layers,
wherein the filaments of the first and second superconductor layers are positioned such that at least one filament of the first layer crosses at least one filament of the second layer.

In another aspect of the invention, a method of making an article is provided. The method includes depositing a precursor solution comprising precursor components to a rare earth-alkaline earth metal-transition metal oxide solubilized in one or more solvents onto an elongated substrate to form a precursor layer; patterning the precursor layer in a pre-determined pattern, said pattern forming a plurality of oxide superconductor filaments extending substantially along the length of the elongated substrate and spaced apart from one another across the width of the elongated substrate, wherein the pattern of the plurality of filaments is periodically shifted in alternating directions across the width by about one filament width; and arranging a barrier layer between a pair of patterned elongated substrates positioned in facing orientation.

In one or more embodiments, the barrier layer is joined with the patterned elongated substrates by soldering.

In one or more embodiments, the method further includes depositing a cap layer onto the patterned elongated substrates.

In one or more embodiments, the steps of depositing and patterning a precursor layer include dropwise depositing a precursor solution in a predetermined pattern, or the step of patterning a precursor comprises using a method selected from the group consisting of sandblasting, laser ablation, e-beam irradiation, ion implantation and deposition of ferromagnetic materials, the step of patterning a precursor comprises introducing thin parallel scratch lines to disrupt the local texture, and facilitate the growth of amorphous or randomly oriented superconductor in the separating the filaments.

BRIEF DESCRIPTION OF THE DRAWING

The invention is described with reference to the following figures, which are presented for the purpose of illustration only and which are not intended to be limiting of the invention and in which like elements are indicated by like numbers in all the figures.

DETAILED DESCRIPTION

Single superconductor layers can be patterned into multiple filaments to reduce local ac losses. Short sample testing shows a reduction in ac loss proportional to the reduction in conductor or filament width. In principle the filaments can be electrically isolated from each other and the absence of a conductive path would strongly reduce so-called interfilamentary coupling losses. However, there are several considerations that make this approach less practical. Even if a "perfect" conductor could be manufactured and patterned, the ends would still need to be soldered to the current injection points and filaments would be shorted. This would allow the formation of giant current loops through these ends.

The second generation HTS wire production is based on a variety of continuous reel-to-reel thin film deposition techniques, practiced over very long lengths as superconducting wires are needed in piece lengths which can reach 1000 meters. Small defects can locally disrupt current transfer, and their effect becomes more serious when the conductor width is reduced. In narrow filaments of, for example, 100 micrometer width, small defects can potentially seriously disrupt local current transfer and render the conductor useless when used in long lengths. A certain degree of current sharing capability between filaments is therefore desired to mitigate the effect of these small defects, allowing currents an alternative path in case of an occasional local current constriction.

Figure 1:
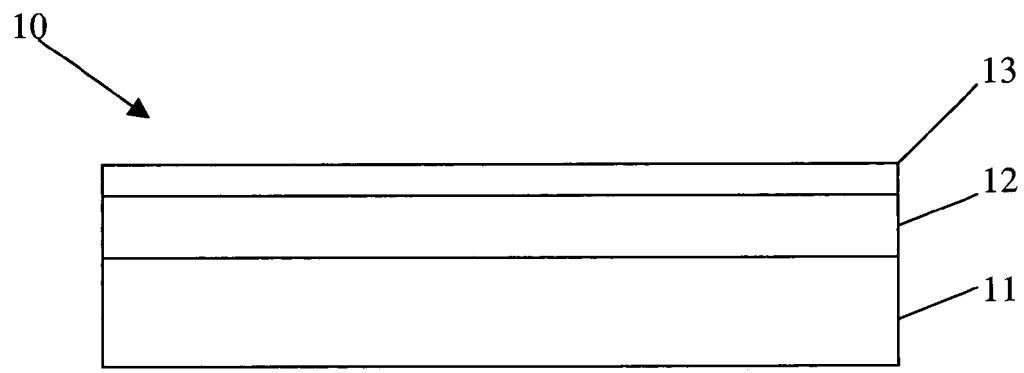
FIG. 1 is a cross-sectional view of a typical superconductor article.
Figure 2A:
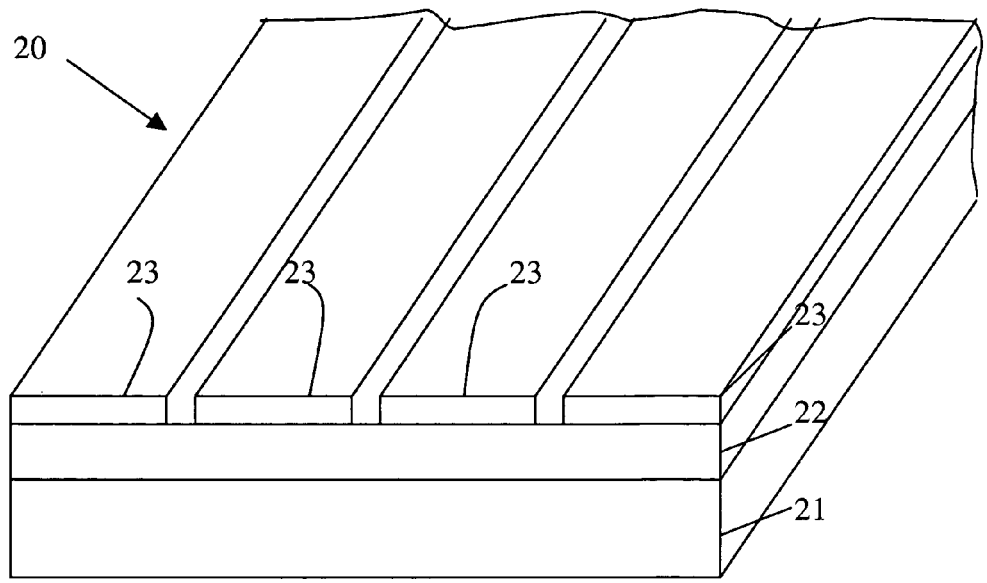
FIG. 2A is a perspective view of a coated conductor article, in which the YBCO film is arranged as a thin filament array.
Figure 2B:
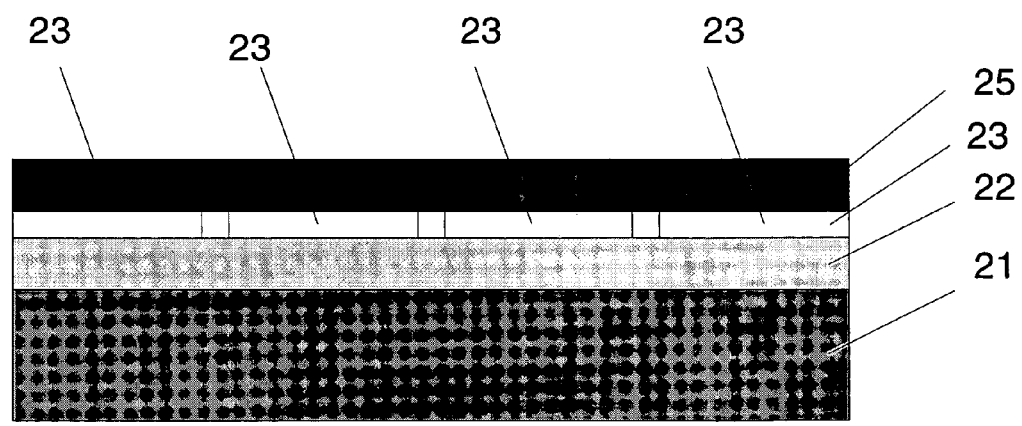
FIG. 2B is a cross-sectional view of a coated conductor article, in which the YBCO film is arranged as a thin filament array, with a common stabilizer layer.

A common stabilizer layer which is located on top of the superconducting filaments and which electrically connects the filaments can offer such a current sharing path. FIG. 2B illustrates a thin filament array 23 having a common stabilizer layer 25. The prime function of the stabilizer is to enhance the mechanical and electrical stability of the superconductor and offer a current path along the length of the conductor in case of a local critical current depression. Perpendicular alternating magnetic fields will cause circulating currents to pass through the superconductor filaments and perpendicular to the current direction, through the stabilizer to the next filament. When the loops become longer, currents through the normal conducting stabilizer will increase and the advantage of the filamentization is lost: the conductor has fully coupled filaments and losses can even exceed a conductor with a single, non-filamentized superconducting layer.

Figure 3:
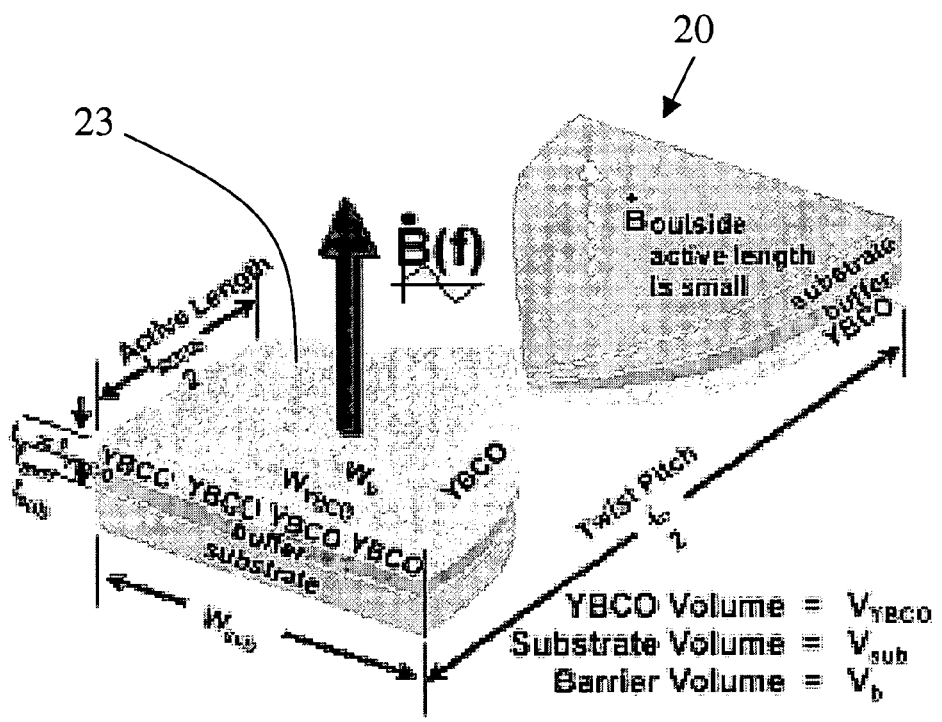
FIG. 3 is a schematic illustration of a twisted coated conductor with minimized ac loss.

An effective way to reduce the interfilamentary coupling losses is to select a stabilizer with enhanced electrical resistivity and twist the superconducting wire. Both approaches have been used successfully in low temperature superconducting wires such as niobium-titanium wire. Twisting small diameter round wires of NbW with a ductile superconductor is relatively easy. The thin filament arrays 23 of coated conductor 20 can, in principle, also be twisted to reduce coupling losses, as is illustrated in FIG. 3. The twist pitch must be long in order to avoid an unacceptable level of mechanical strain in the wire. Even low-strain twisting of less than 0.1% is difficult to accomplish and the twist pitch is very long, at the very least an order of magnitude higher than in low temperature superconductors, thereby limiting its effectiveness in reducing ac loss. Building a magnet using a twisted tape poses challenges as well, and uses the available space less effectively, thereby reducing the energy density of the device in a negative manner.

In one aspect of the present invention, low ac loss HTS coated conductor wire contains a number of parallel current path along the length of the superconducting layers having transpositions of the parallel paths, e.g., filament crossovers, at selected points. The parallel current paths are substantially physically isolated from one another along the wire length, are transposed at selected points while retaining their electrical isolation, and are electrically connected to one another at the ends of the length of wire. In other embodiments, the filaments have current through a current stabilizer.

An exemplary superconducting article having reduced ac losses includes a wire or wire having a textured surface and an array of superconducting oxide filaments extending substantially continuously along the length of the textured surface of the wire, wherein the filaments are substantially electrically and/or physically isolated from one another along their length. Periodic connections between adjacent filaments can be provided, however, to enhance current continuity from filament to filament and to offset defects that periodically arise in the superconducting material. Alternatively, the filaments are connected through a stabilizer layer bonded to the top of the filaments, with sufficient electrical resistivity to reduce interfilamentary coupling losses to an accepted level. The filaments are located in at least two layers, and the filaments of the upper layer are positioned or stacked above the filaments of the lower layer. The filaments are patterned or arranged so that a filament of the upper and/or lower layer periodically shifts across the width of the upper and/or lower layer by about one or more filament positions and thereby crosses over (or under) at least one filament in the other layer. The filament crossing reduces ac losses in long lengths of HTS coated wired without the need for twisting the wires. Additional layers may be included in the superconducting article and the filament pattern is selected so that filament crossing occurs among the filament layers.

By "cross" or "crossing," it is meant that one or more filaments shifts its position so as to pass from one side of a second filament to the other without contact or intersection of the filaments during crossing. A cross occurs when the filaments lie in different planes, that is, the filaments are arranged in layers that are stacked in a three-dimensional assembly. A "crossing" or a "cross" includes those filament patterns in which a shifting filament passes "over" a stationary filament, e.g., "cross over," a shifting filament passes "under" a stationary filament, e.g., "cross under," or both upper and lower filaments shift during crossing.

Figure 4:
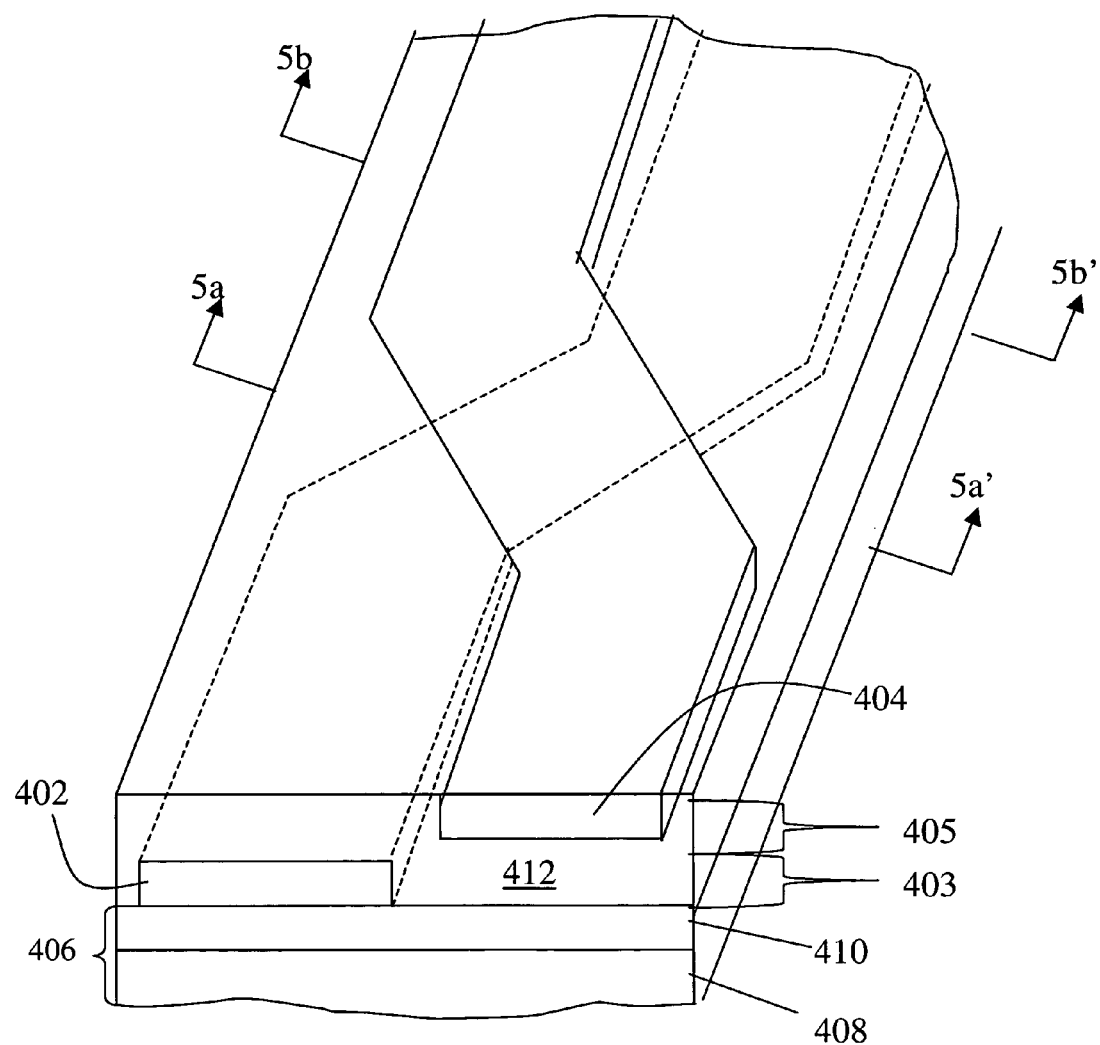
FIG. 4 is an illustration of a low ac loss multifilamentary superconductor article illustrating periodic crossover of the filaments in which the filaments occupy two different planes.

FIG. 4 illustrates an embodiment of the present invention, in which superconducting filaments are positioned in two layers and cross one another without having to twist the coated conductor. For the purposes of simplicity, an exemplary two-filament article 400 illustrates this design, however, the layers may include any number of filaments. Filaments 402, 404 are positioned on a textured base 406 having a metal substrate 408 and buffer layer(s) 410. FIG. 4 can also illustrate a portion of a superconducting article representing two single layers coated conductors positioned in facing arrangement, in which the upper substrate is removed for clarity.

The metal substrate is typically a metal or alloy, and of example, is a nonmagnetic alloy. A RABiTS™ (rolling-assisted, biaxially textured substrates) textured template is typically used. A RABiTS™ substrate is a roll-textured and annealed metal wire, e.g., nickel, covered with one or more oxide or metal buffer or conditioning layers. Another variation used to prepare the textured template is ion beam assisted deposition or IBAD. Examples of buffer layer materials include metals and metal oxides, such as silver, nickel, MgO, $Al_2O_3$, GaOx, rare earth oxides such as $Tb_2O_3$ $Gd_2O_3$, $CeO_2$, $Y_2O_3$, ternary compounds such as yttria-stabilized zirconia (YSZ), $LaAlO_3$, $SrTiO_3$, $LaNiO_3$, $LaCuO_3$, $SrRuO_3$, $NdGaO_3$, $NdAlO_3$ and nitrides as known in the art. The resulting textured base serves as a template for the HTS compound, e.g., yttrium-barium-copper-oxide (YBCO) or alternatively with a rare earth substituted for the Y.

Filament 402 is located in a first region or layer 403 closest to base 406. Filament 404 is positioned in a region or layer 405 located above the first region 403 containing filament 402. The filaments are configured to form a pathway that results in the crossover of filaments 402 and 403. In order to prevent shorting between filaments and to reduce coupling losses, a filler material 412 is interposed between the filaments 402, 404. The filler material 412 may substantially surround the filaments along their length. The filler material 412 may also serve as a matrix into which the filaments are embedded.

Filler material 412 can be an insulating material or medium or high resistivity material that is selected to mechanically isolate the adjacent filaments and/or to increase resistivity between the filaments. Higher resistivity is associated with reduced ac losses. In one or more embodiments, filler material 412 is an insulating material, e.g., ceramic materials such as barium zirconate or HTS superconductor that has been poisoned by the additional of a metal contaminant, e.g., zinc-contaminated YBCO or $PrBa_2Cu_3O_{7-x}$. $PrBa_2Cu_3O_{7-x}$ has the added advantage of having a lattice structure similar to that of YBCO, so that it can be textured in a manner similar to YBCO. Filler material 412 may be a material that is not superconducting and that is a poor conductor, e.g., amorphous YBCO. Use of a material with low conductivity in the gap between filaments within a single layer allows some current sharing between filaments and can help the electrical stability of the article.

Figure 5A:
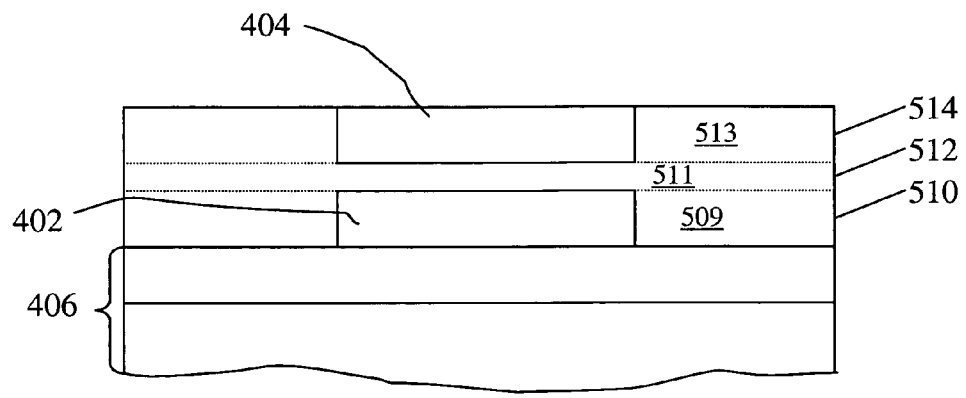
FIG. 5A is a cross-sectional view of the multifilamentary superconductor article of FIG. 4 along line 5a-5a', and 5B is a cross-sectional view of the multifilamentary superconductor article of FIG. 4 along line 5b-5b'.
Figure 5B:
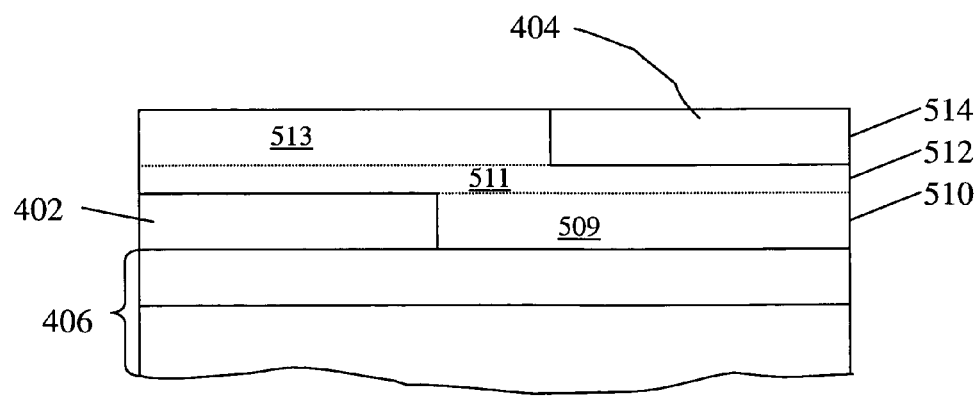

FIGS. 4 and 5A-B illustrate a filament pattern in which both the upper and lower filaments shift position along the width of the substrate during crossover. Thus filament 402 shifts from a first position at the left hand side of the substrate to a second position at the right hand side of the substrate, while filament 404 shifts from a first position at the right hand side of the substrate to a second filament at the left hand side of the filament.

FIG. 5A illustrates a cross-section of the coated conductor of FIG. 4 at line 5a-5a', where the two filaments 402, 404 cross over each other. Interposed between and around the two filaments is a layer of material 511 that isolates the two filaments and prevents shorting. FIG. 5B illustrates a cross-section of the coated conductor of FIG. 4 at line 4b-4b', where the two filaments 402, 404 are spaced apart from each other on the substrate 406 of the coated conductor. Material 511 is in contact with each filament and isolates the two filaments 402, 404 from one another. Because the filaments lie in two different regions, there is no exchange of filament positions. However, the filaments cross over one (or under) another and may occupy positions along the width of the substrate that complement one another or overlap one another.

In one or more embodiments the filaments are not electrically insulated but are connected through a common barrier layer. A barrier layer 511 can be disposed between layer 403 and 405. To reduce interfilamentary coupling losses (currents run perpendicular to the wire or tape direction, from filament-to-filament, through the metal stabilizer) the barrier needs to have a medium to high resistivity. Medium to high resistivity is associated with reduced ac losses. Exemplary medium resistivity materials include, for example, brass, copper-aluminum bronze, copper-tin bronze, copper with around 10-40% nickel, with resistivities of around 5-40 mircro-ohm cm at cryogenic temperatures. Exemplary high resistivity materials include_, for example, copper with 40-50% nickel such as Constantan™, (resistivity of around 50 microohm-cm) and most commercial nickel alloys with substantial additions such as nickel-20% chromium, Hastelloy™, Inconel™, and most commercial stainless steels, with resistivities of around 100-120 microohm-cm at cryogenic temperatures.

Alternating perpendicular magnetic fields can induce current loops in a local area that can be cancelled by loops in neighboring areas that are comparable to the induced currents introduced in twisted superconducting wires, (but without the strain) thereby reducing the ac losses.

The articles may further include a cap layer disposed on top of the YBCO layer and a stabilizing layer deposed on the cap layer over the patterned superconductor filaments. The cap layer is an inert protective layer that provides a physical and chemical barrier to the environment. Exemplary cap layers include noble metals, such as silver. A stabilizing layer is used to provide improved mechanical and electrical stability during use, and reduce tensile and compressive strains on the superconductor filaments. For example, a thin layer of silver can be deposited on the superconductor filaments, thereby forming a composite with the superconducting layer and enabling the lamination of a hardened copper strip by soldering onto the silver.

Figure 6A:
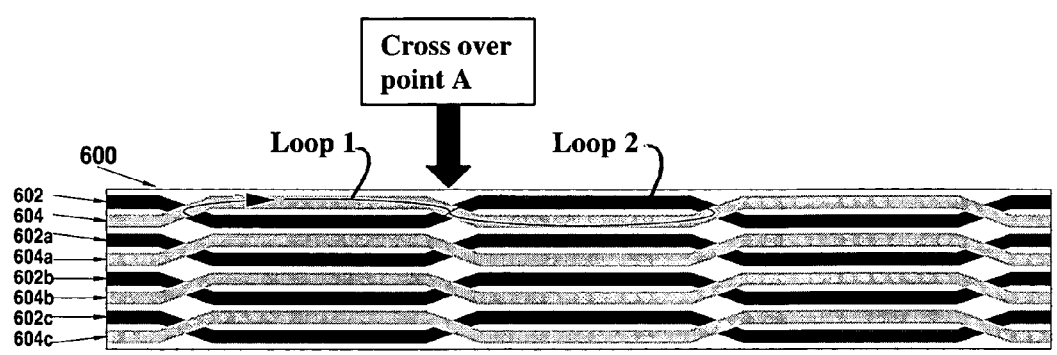
FIG. 6A and FIG. 6B is a schematic illustration of a filament pattern having a periodic crossover of superconducting filaments according to one or more embodiments of the present invention.
Figure 6B:
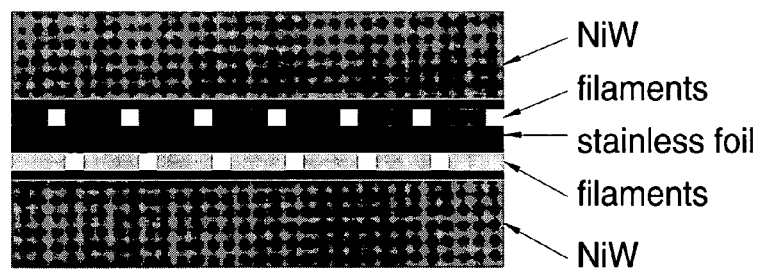

Other non-limiting examples of filament patterns including at least one filament crossover are shown in FIG. 6A. FIG. 6A schematically illustrates a portion of eight filaments arranged in two layers (depicted by different line forms) that shift periodically across the width of the substrate by one filament position. Filament pairs (602, 604), (602a, 604a), and (602b, 604b) and (602c, 604c) crossover one another periodically along the elongated substrate length. FIG. 6B shows a perpendicular cross section of this conductor roughly at the intersection points of top and bottom filaments. The top and bottom layer are separated in this case by a thin stainless steel layer. When the conductor experiences an alternating magnetic field with a perpendicular field component, local current loops are set up to counter the effect of the alternating magnetic field. An example is shown for two local regions in FIG. 6A where a local current runs in filament 602 and 604. The current Loop 1, induced by the magnetic field, runs through 604, through the separating stainless steel layer, then through 602 as it runs parallel to 604, then back through the stainless layer, and back through 604 again. A similar loop (Loop 2) is induced right next to the loop just described, and the two current loops oppose each other in direction at the cross-over point A and tend to cancel each other. Similar loops are generated in the other areas, thereby greatly reducing ac losses.

Figure 7:
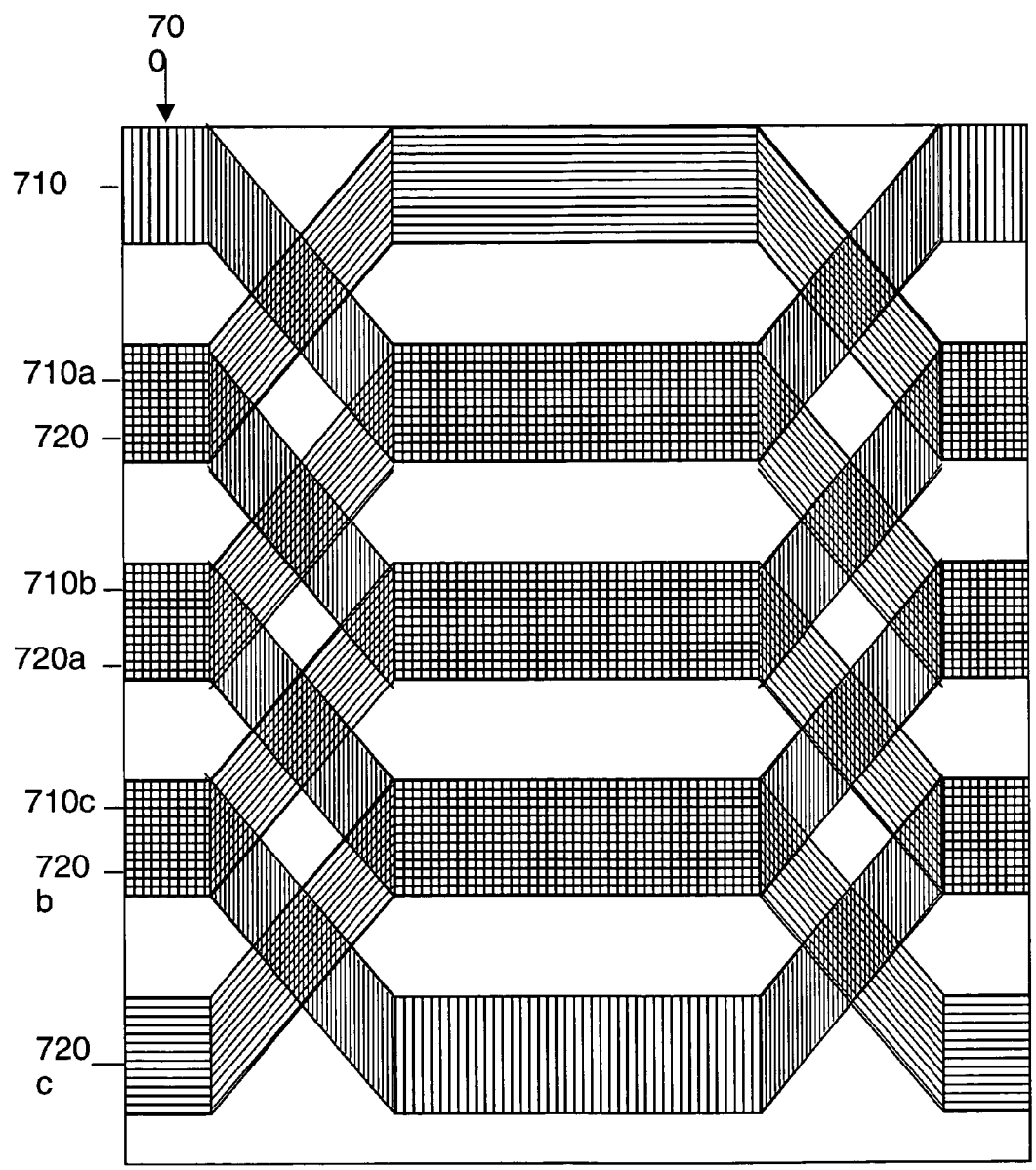
FIG. 7 is a schematic illustration of a filament pattern having a periodic crossover of superconducting filaments according to one or more embodiments of the present invention.

FIG. 7 schematically illustrates a similar structure as shown in FIG. 6 but now with a filament spacing that is much closer than shown in FIG. 6. The advantage is a better use of available area for current transfer, allowing higher engineering (overall) critical currents. FIG. 7 shows a portion of a mutilfilamentary wire 700, in which the filaments of each filament layer are periodically shifted between two filament positions. The upper and lower filament layers are mirror images of one another. Thus, filaments 710, 710a, 710b, 710c (indicated by horizontal lines), located in a lower filament level, shift first upwards towards the upper edge of the wire substrate and then return to their original position and filaments 720, 7201, 720b, 720c (indicated by vertical lines), located in an upper filament level, first shift downwards towards a lower edge of the substrate and then return to their original position. Except during crossover, the filaments in the upper and lower layers are in overlapping positions. Filaments from upper and lower filament layers, for example, filaments 710a and 720, respectively, start at the left hand side of the illustrated portion of the superconducting article 700 in an overlapping position. Filament 710a shifts downward passing under upwardly shifting filament 720a and occupies a position on the lower filament layer that overlaps with filament 720b. In a similar fashion, filament 720 shifts upward passing over downwardly shifting filament 720 and occupies a position on the upper filament layer that has no counterpart filament in the lower filament layer. The filamentary structure of FIG. 7 reduces ac losses in a manner as described under the filamentary structure of FIG. 6, and reduces ac losses. Due to the partial filament overlap the effectiveness of the ac loss reduction is somewhat less than that of the filamentary arrangement of FIG. 6. The filamentary arrangement of FIG. 6 will be favored when a combination of high ac loss reduction and medium engineering (overall) critical current density is desired. The filamentary arrangement of FIG. 7 will be favored when a combination of high engineering (overall) critical current density and medium ac loss reduction is desired.

The number and placement of crossing points is determined, in part, by the performance of the superconducting tape at the projected operating conditions of the superconducting device and the maximum allowable ac losses. W. J. Carr calculated the loss dependence on twist pitch and transverse resistivity for a patterned thin film conductor, which was assumed, twisted. From this model it can be concluded that the repeat distance will be in the range of 1 meter for a 60 Hz alternating magnetic field with a 0.1 T amplitude if losses are not to exceed 0.25-0.5 mW/Am, using a stabilizer with a resistivity of 50 100 microohm-cm. If the perpendicular field amplitude component as seen by the conductor is less the repeat distance can be increased proportionally. (W. J. Carr et al, "Filamentary YBCO Conductors for AC applications", IEEE Trans. Appl. Superc. 9, pp. 1475-1478, (1999). Repeat distances of about 0.05 m to 50 m, or about 0.2 m to 10 m, are contemplated.

Filaments are shown here for illustrative purposes as stepped shift, oscillating between two filament positions, however any pattern may be used. In some embodiments, more than two filaments are employed in the device. In addition, a filament may overlap with one or more filaments to form the low ac loss pattern. The arrangement of filaments in a low ac loss multifilament coated HTS article is not limited to the examples described herein. Other filament patterns including at least one filament crossover will be readily apparent to one of skill in the art and are contemplated as within the scope of the invention.

The multifilamentary pattern can be prepared using a variety of methods. By way of example only, patterns can be introduced into a thin film of superconducting material by abrasive milling, laser ablation, chemical etching, mechanical scribing, e-beam irradiation, ion implantation and deposition of ferromagnetic materials (iron). Abrasive milling, laser ablation, chemical etching and mechanical scribing physically remove YBCO material leaving behind a portion of the YBCO that forms the desired patterned filament structure. E-beam irradiation, ion implantation and deposition of ferromagnetic materials result in damage to exposed regions of the YBCO film transforming these regions into essentially non-superconducting material. The YBCO material that was not damaged forms the desired patterned filament structure.

An alternative approach to the fabrication of multifilamentary articles having the configurations described herein is to use fabrication techniques that allow the building of the three-dimensional stacked filament layer structures. Three-dimensional printing is one technique that can be used to build the multiple layers of oxide superconductor and filler material at the crossover point. Further information is found in copending application United States Serial No. TBD, entitled "Dropwise Deposition of a Patterned Oxide Superconductor," and filed on even date herewith, which is hereby incorporated in its entirety.

The patterned filamentary superconducting oxide layer can be prepared by controlled deposition of droplets of a solution, e.g., dropwise deposition, containing precursor components to an oxide superconductor. The patterned layer is then converted into a patterned oxide superconductor. The method may be used to deposit a plurality of narrow strips of oxide superconductor in the patterns and configurations described herein in order to significantly suppress the ac loss of second generation coated conductor articles.

Precursor components to an oxide superconductor are dissolved in a suitable solvent to form a solution. A precursor component includes a metal source, e.g., a metal salt, metal compound and metal-organic compound and the like, that can be further processed (along with other precursor components) to form an oxide superconductor. The precursor components can include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. A typical precursor solution includes the salts of yttrium, barium and copper, wherein at least one of the metal salts is a trifluoroacetate. Precursor components that permit pinning centers to be introduced into superconducting thin films may also be added to the precursor solution. For example a dopant component including a metal compound having a dopant metal capable of replacing one or more of the rare earth and alkaline earth metal of the rare-earth/alkaline-earth-metal/transition metal oxide or an additive component containing one or more metal compounds capable of forming a second phase nanoparticle can be included in the precursor solution. The solvent or combination of solvents used in the precursor solution can include any solvent or combination of solvents capable of dissolving the metal sources. Such solvents include, for example, water and alcohols, including methanol, ethanol, isopropanol and butanol.

The solution is introduced into a dispensing device that has at least one nozzle through which the solution may be discharged, continuously or intermittently on demand, in the form of discrete fine droplets. The precursor solution may be dispensed through a plurality of dispensing devices and/or through a plurality of nozzles or nozzle orifices. The dispensed precursor solution is deposited onto a textured target surface essentially point by point to form a thin film in a predetermined pattern. Thus, a high degree of precision can be realized.

In one or more embodiments, an inkjet printer is used to dropwise deposit the precursor solution. Inkjet printer technology provides continuous deposition of long lengths of superconductor material on moving substrates. Any desired distribution of interfilament bridges is achievable and can be precisely applied. Both the spacing between filaments and the distribution of bridges can be precisely controlled using computer control, as is currently employed in conventional inkjet printing. An appropriate insulator material (or other second material) is deposited in the interfilament gaps using, for example, an additional set of printer heads with a second insulator solution. Droplets with spot sizes as small as 10 μm in the lateral dimension have been created by inkjet methods, which provides adequate interfilament resolution.

The precursor components are then heated to convert the precursors into an oxide superconductor. Exemplary precursor components include a salt of a rare earth element, a salt of an alkaline earth metal, and a salt of a transition metal, wherein at least one of the salts is a fluoride-containing salt. The precursor components are converted into an oxide superconductor by treating the precursor film to form an intermediate metal oxyfluoride film including the rare earth, the alkaline earth metal, and the transition metal of the precursor solution, and thereafter converting the oxyfluoride film into an oxide superconductor.

Figure 8:
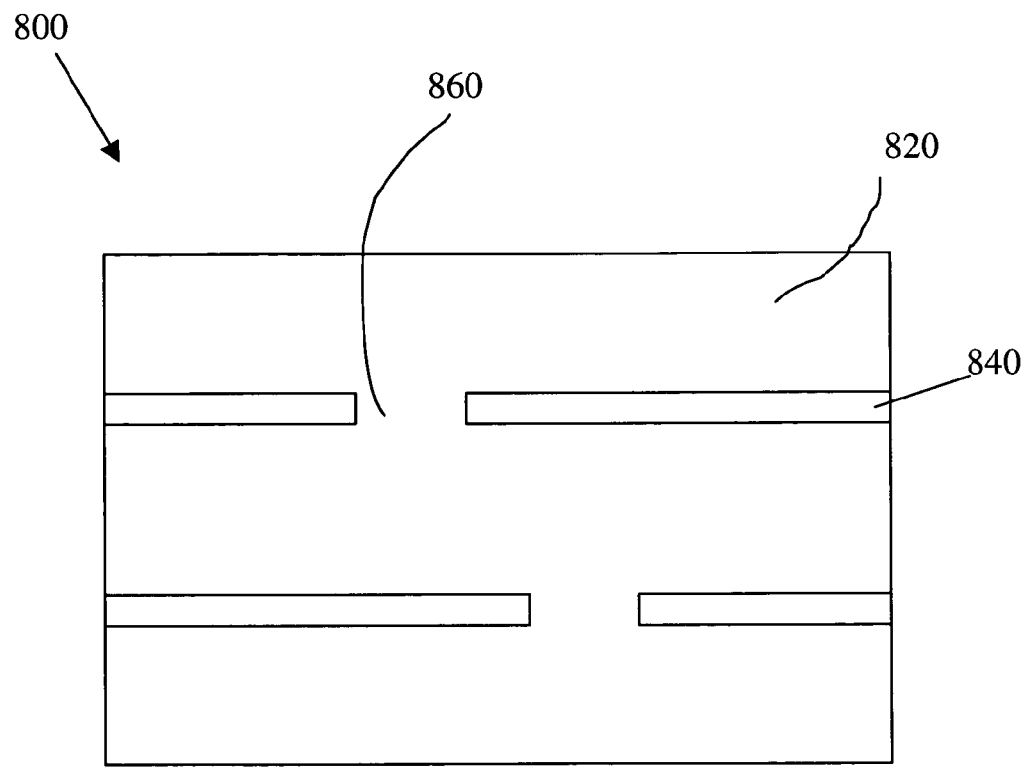
FIG. 8 is a schematic top view of a portion of a HTS wire illustrating conductive bridges between filaments.

Dropwise deposition enables the method to put down material at any point on the target substrate. Thus, material can be deposited within the gaps or spacings between the filaments of the filament array. For example, additional precursor solution is deposited at random or periodic intervals to form superconducting or conductive bridges between adjacent filaments. Periodic bridges provide current continuity from filament to filament and offset defects that periodically arise in the superconducting material. Alternatively, a second material is deposited within the gaps between filaments, such as an insulating material or medium or high resistivity material or precursor thereto that is selected to mechanically isolate the adjacent filaments and/or to increase resistivity between the filaments. An exemplary bridge is illustrated in FIG. 8. FIG. 8 is a top view of a coated conductor architecture 800 having an array of continuous filaments 820 separated by gaps 840. The architecture includes periodic bridges 860 that span the gap 840.

Using multiple passes over the substrate, it is possible to form a multilayer structure at the crossover location containing the physically separated filaments. Referring again to FIGS. 4 and 5A-B, the filaments 402, 404 can be deposited using dropwise deposition of precursor materials using 3D printing techniques described above that enable the sequential deposition of multiple layers. In a first deposition step filament 402 and a high resistivity or insulating material 509 are deposited to form layer 510 by dropwise deposition of suitable precursor materials. In the case of material 509 used in the deposition of high resistivity or insulating material, a precursor may not be necessary and the final insulating or high resistivity material can directly deposited. Material 509 is deposited to fill any space not occupied by filament 402. In a second deposition step, a layer of high resistivity or insulating material 511 is deposited to form layer 512. Additional layers may be deposited as needed, including a cap layer or other barrier layer, between the two filament layers. The layer 512 is of a thickness to provide the appropriate isolating effect between filaments 402 and 404 at their closest approach. In a third deposition step, filament 404 and high resistivity or insulating material 513 are deposited to form layer 514. Material 513 is deposited to fill any space not occupied by filament 404. Materials 509, 511 or 513 may be the same or different. They may form a continuous material that separates the two filaments, and the boundaries between the layers are therefore shown using a dotted line.

In another embodiment of the present invention, a low ac loss stacked filament superconductor wire is prepared using two individual HTS elongated articles, each having a single layer of patterned superconducting oxide filaments, which are bonded in face-to-face arrangement to form crossed filaments. At least one of the HTS articles includes a filament pattern in which at least one filament shifts across the width of the layer surface by about one or more filament positions. The two HTS articles are arranged in face-to-face fashion so that at least one filament of the first article crosses at least one filament of the second article. The filaments are typically covered with a cap layer and the cap layers can be joined using soldering, diffusion bonding or other similar processes. Alternately, an interface layer is interposed between the two exposed filament layers and the superconducting articles are bonded at the filament layer to the interface layer.

Figure 9A:
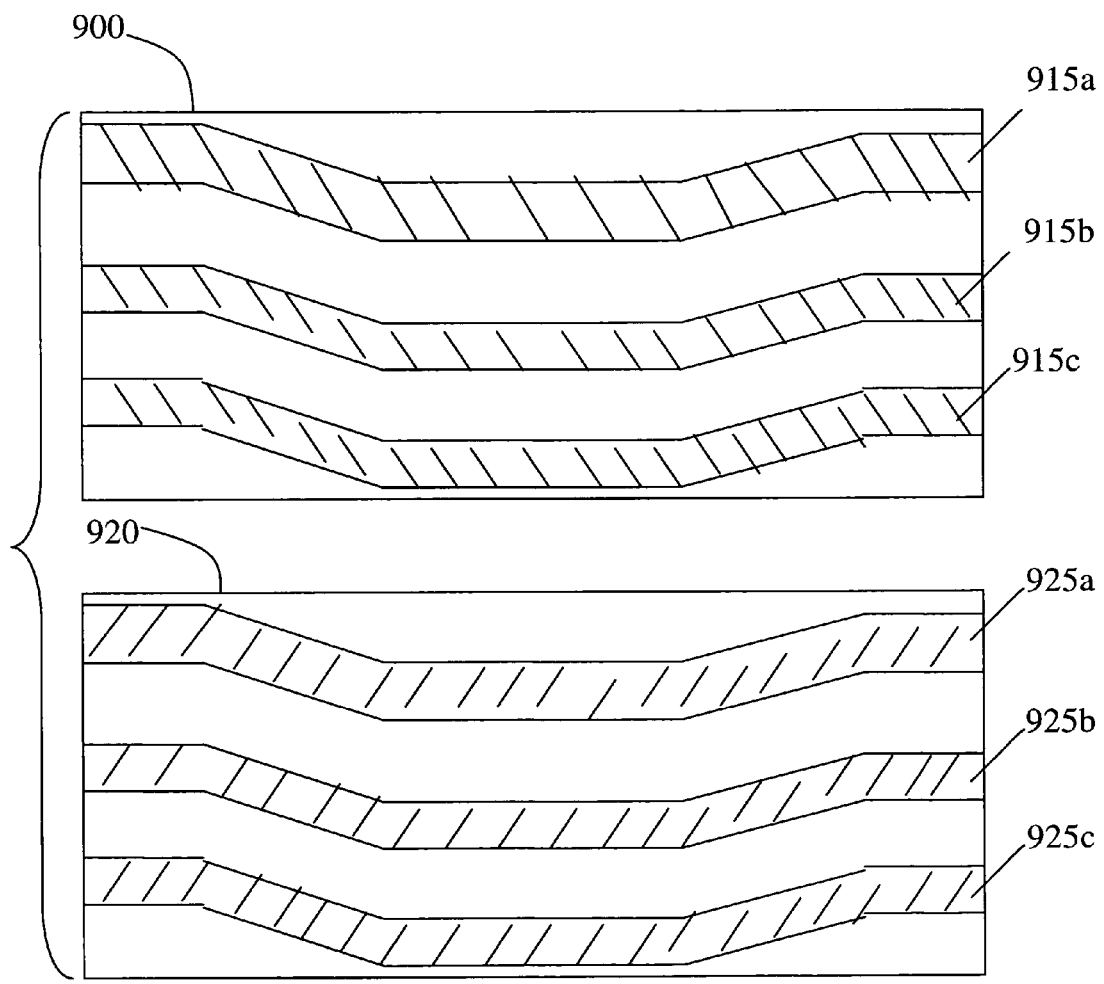
FIG. 9A is a top view of portions of two filamentary HTS wires for assembly in a face-to-face wire.

FIG. 9A is a top view of a portion of two individual superconducting wires 910, 920 that can be joined to form a face-to-face low ac loss article, as for example, is shown in FIG. 6A. The filaments each filament layers 910, 920 are periodically shifted between two filament positions. Filaments 915a, 915b, and 915c are located in the upper filament layer 910, and filaments 925a, 925b, and 925c are located in the upper filament layer 920. The filaments patterns shown here are identical; however, in practice the filament layers may differ in both number of filaments and/or filament pattern. Each wire includes a substrate which can be a metal or alloy, and is preferably a nonmagnetic alloy; a buffer layer which can include single or multiple layers formed of oxides, nitrides and/or metals; and, the superconducting layer which is typically YBCO or alternatively with a rare earth substituted for the Y. An additional cap layer may be deposited, which can be, for example, silver and could incorporate as an option an additional normal metal layer to provide thermal and electrical mass.

Figure 9B:
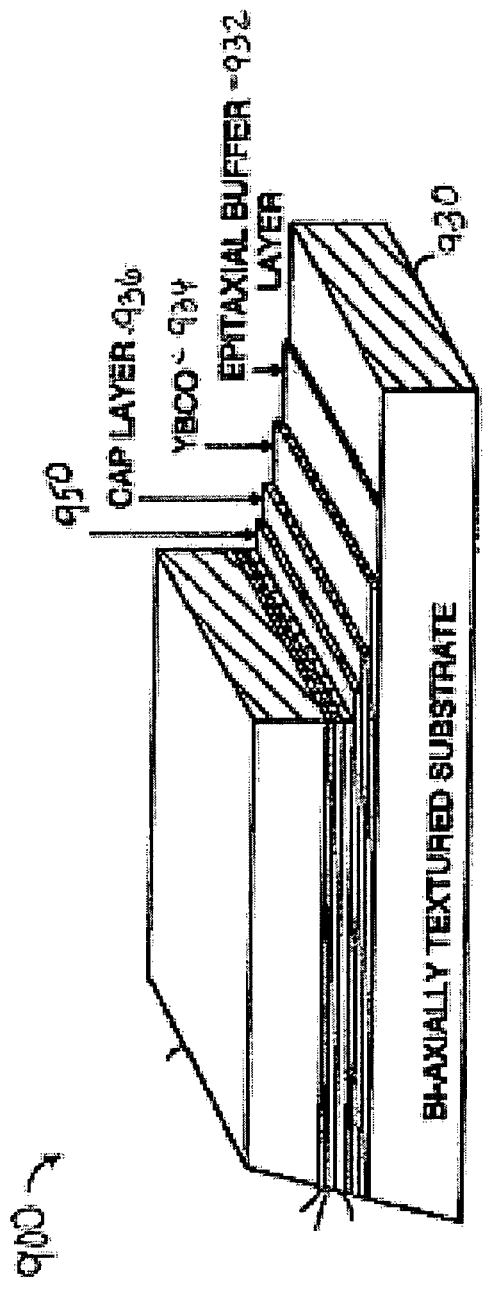
FIG. 9B is a view of an assembled face-to-face structure.
Figure 9C:
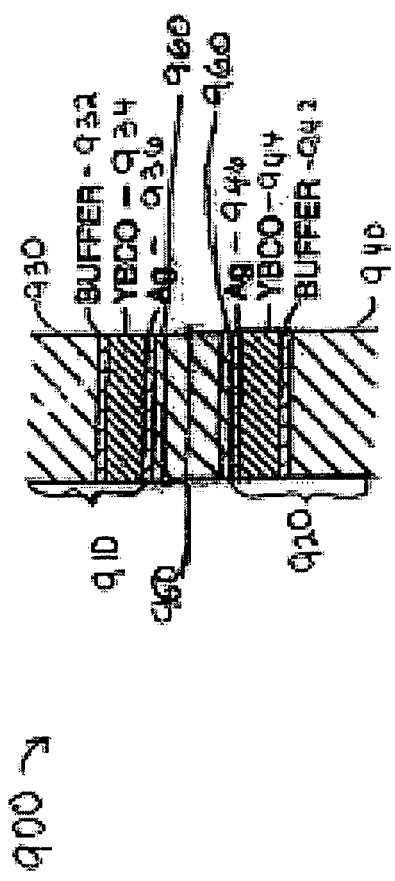
FIG. 9C is an expanded view of FIG. 9B illustrating the layers of the wire.

As shown in FIGS. 9B and 9C, a low ac loss stack filament article 900 includes first patterned HTS wire 910 having substrate 930, buffer layer 932, patterned HTS layer 934, and cap layer 936. Likewise, a second HTS patterned wire 920 includes substrate 940, buffer layer 942, patterned HTS layer 944 and cap layer 946.

The patterned HTS wires can be formed using known processes, as described herein. Substrates 930 and 940 can be nonmagnetic metals. Buffer layers 932 and 942 can be deposited epitaxially and each may be formed of one or more layers. Buffer layers 932 and 942 can be formed of any material capable of supporting HTS layers 934 and 944. Examples of buffer layer materials include metals and metal oxides, such as silver, nickel, $TbO_x$, $GaO_x$, $CeO_x$, yttria-stabilized zirconia (YSZ), $Y_2O_3$, $LaAlO_3$, $SrTiO_3$, $LaNiO_3$, $Gd_2O.sub.3$, $LaCuO_3$, $SrRuO^3$, $NdGaO_3$, $NdAlO_3$ and nitrides as known in the art.

HTS layers 934 and 944 are can be deposited epitaxially using one of the methods described herein. HTS layers 934 and 944 include any HTS material, for example, yttrium-barium-copper-oxide superconductors (YBCO), bismuth-strontium-calcium-copper-oxide superconductors (BSCCO), and thallium based superconductors.

Cap layers 936 and 946 can each include at least one noble metal layer. "Noble metal", as used herein, is a metal whose reaction products are thermodynamically unstable under the reaction conditions employed to prepare the HTS wire. Exemplary noble metals include for example silver, gold, palladium and platinum. Noble metals provide a low interfacial resistance between the HTS layer and the cap layer. In addition, cap 936 and 946 can each include a second layer of normal metal (e.g. Cu or Al or alloys of normal metals).

A barrier stabilizing layer 950 is disposed between cap layers 936 and 946. To reduce interfilamentary coupling losses (currents run perpendicular to the wire or tape direction, from filament-to-filament, through the metal stabilizer) the layer 950 needs to have a medium to high resistivity. Medium to high resistivity is associated with reduced ac losses. Exemplary medium resistivity materials include, for example, brass, copper-aluminum bronze, copper-tin bronze, copper with around 10-40% nickel, with resistivities of around 5-40 mircro-ohm cm at cryogenic temperatures. Exemplary high resistivity materials include, for example, copper with 40-50% nickel such as Constantan™, (resistivity of around 50 microohm-cm) and most commercial nickel alloys with substantial additions such as nickel-20% chromium, Hastelloy™, Inconel™, and most commercial stainless steels, with resistivities of around 100-120 microohm-cm at cryogenic temperatures.

The individual conductors 930 and 940 are then joined at the respective cap layers 936 and 946 to the stabilizing layer 950 using one of a variety of methods. For example, and while not to be construed as limiting, exemplary joining techniques include soldering and diffusion bonding. An exemplary solder embodiment is shown in shown in FIGS. 9B and 9C, with the resulting solder layer between the cap layers 936 and 946 being illustrated as reference numeral 960 (or the interface in the case of diffusion bonding). Alternatively, if no cap layers are used, an intervening layer, preferably metallic, may be bonded to the two HTS layers.

Further information on the assembly of face-to-face conductors is found in U.S. Pat. No. 6,765,151, which is hereby incorporated by reference.

Figure 10:
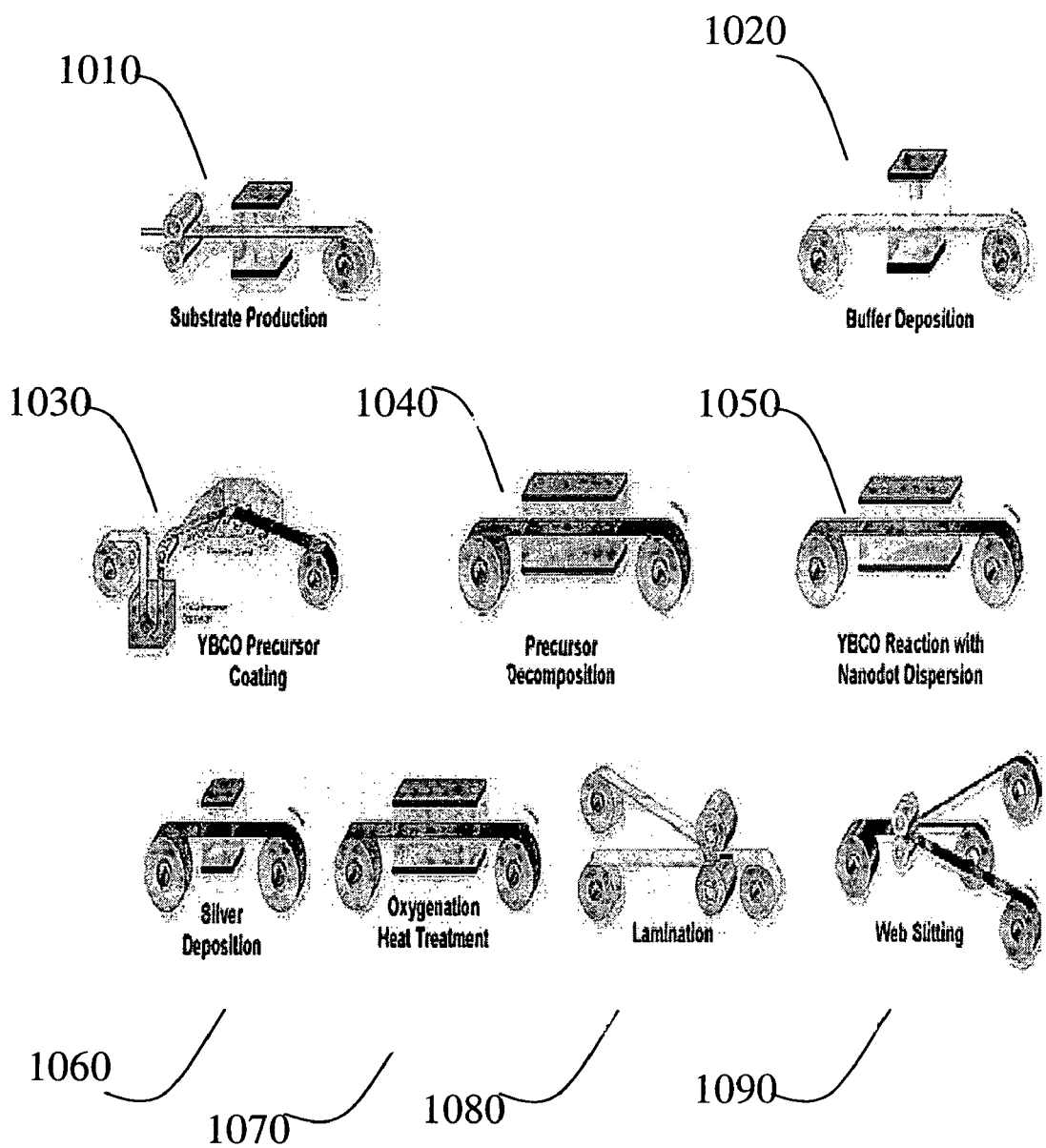
FIG. 10 is a schematic illustration of a system and process used to prepare a textured, patterned oxide superconductor wire according to one or more embodiments of the present invention.

A typical coated conductor manufacturing process is shown in FIG. 10. Description of printing a precursor film on a textured template having the architecture $CeO_2/YSZ/Y_2O_3/NiW$ is described. The textured template is provided in widths of about 1 to 4 cm.

As shown in FIG. 10, at a first station 9100, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of the surface have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a wire or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Mo, V, Ta, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 1020, a buffer layer is formed on the textured substrate. The buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., Si3N4).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a patterned precursor solution is deposited in deposition station 1030 as described above. Additional equipment may be required to accomplish patterning operation, for example, when laser ablation or ion bombardment are used to pattern the superconducting layer. If dropwise patterned deposition is used, then a single station equipped with a inkjet printer deposition apparatus can accomplish both deposition and patterning of the oxide precursor solution.

At a subsequent station 1040, the precursor components are decomposed. The conversion of the patterned precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired superconductor layer at a further processing station 1050. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature at in a nominal gas environment with an oxygen pressure of about 0.05 Torr to about 150 Torr, preferably about 0.1 Torr to about 0.5 Torr and more preferably from about 0.1 Torr to about 0.2 Torr.

The resultant superconductor layer is well-ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or wire.

Further processing by noble metal deposition at station 1060, oxygen anneal at station 1070, lamination at station 1080 and slitting at station 1090 complete the process, thereby allowing for the low cost fabrication of low ac loss coated conductor wires.

The arrangement of filaments in a low ac loss multifilament coated HTS article is not limited to the examples described herein. Other filament patterns including at least one filament crossover will be readily apparent to one of skill in the art and are contemplated as within the scope of the invention.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces,' PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. patent application Ser. No. 09/579,193, filed on May 26, 2000, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. patent application Ser. No. 10/208,134, filed on Jul. 30, 2002, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same," and commonly owned U.S. patent application Ser. No. 09/615,999, filed on Jul. 14, 2000, and entitled "Superconductor Articles and Compositions and Methods for Making Same;" and U.S. Provisional Application No. 60/477,613, filed Jun. 10, 2003, and entitled "Superconductor Methods and Reactors; and U.S. Utility application Ser. No. 10/858, 309, filed Jun. 4, 2004, and entitled "Superconductor Methods and Reactors," all of which are hereby incorporated by reference.

What is claimed is:

1. An elongated article comprising:
   a first layer of oxide superconductor filaments extending substantially along the length of the elongated article and spaced apart from one another across the width of an elongated substrate;
   an second layer of oxide superconductor filaments extending substantially along the length of the elongated article and spaced apart from one another across the width of the elongated article, wherein the first filament layer is positioned above the second filament layer; and
   a barrier layer positioned between the first and second filament layers,
   wherein the filaments of the first and second filament layers are positioned such that at least one filament of the first layer crosses at least one filament of the second layer.

2. The article of claim 1, wherein the second filament layer is disposed on an elongated substrate having a textured surface.

3. The article of claim 2, wherein the first filament layer is disposed on an elongated substrate having a textured surface.

4. The article of claim 1, wherein the crossing filament of the first layer occupies first position across the width of the elongated substrate before the crossing and a second position across the width of the elongated substrate after crossing.

5. The article of claim 1, wherein at least one filament of the second layer crosses at least one filament of the first layer.

6. The article of claim 1, wherein a plurality of filaments in the first layer crosses at least one filament in the second layer.

7. The article of claim 1, wherein the article comprises about 2 to about 100 filaments.

8. The article of claim 1, wherein the space between adjacent filaments is in the range of about 10 $\mu$m to about 100 $\mu$m.

9. The article of claim 1, wherein the space between adjacent filaments comprises a poorly conductive material.

10. The article of claim 1, wherein the space between adjacent filaments comprises a material of medium to high resistivity.

11. The article of claim 1, wherein the space between adjacent filaments comprises a conductive bridge between adjacent filaments.

12. The article of claim 1, wherein the barrier layer comprises medium to high resistivity material.

13. The article of claim 12, wherein the medium to high resistivity material is selected from the group consisting of copper-nickel alloy, nickel alloys and stainless steel.

14. The article of claim 1, wherein the barrier layer comprises a conductive oxide.

15. The article of claim 2, further comprising a cap layer disposed above the first filament layer.

16. The article of claim 15, wherein the cap layer comprises a noble metal.

17. The article of claim 16, further comprising a stabilizer layer disposed on the cap layer.

18. The article of claim 17, wherein the stabilizer layer comprises a medium to high resistivity metal.

19. The article of claim 1, wherein the filaments have a width of about 50 to 1000 $\mu$m.

20. The article of claim 1, wherein the distance along the length of the article between neighboring crossing locations is in the range of about 0.05 m to about 100 m.

21. The article of claim 1, wherein the distance along the length of the article between neighboring crossing locations is in the range of about 0.2 m to about 10 m.

22. The article of claim 2 or 3, wherein the substrate comprises a metal comprising a biaxially textured surface.

23. The article of claim 22, wherein the substrate further comprises an epitaxially textured oxide buffer layer disposed on the biaxially textured metal surface.

24. The article of claim 1, further comprising one or more additional filament layers disposed between the first and second filament layers, wherein the at least one filament of the additional filament layers crosses a filament of the first or second filament layer.

25. The article of claim 1, wherein the oxide superconductor comprises a rare earth-alkaline earth-copper oxide.

* * * * *